United States Patent
Hong et al.

(10) Patent No.: US 9,397,176 B2
(45) Date of Patent: Jul. 19, 2016

(54) METHOD OF FORMING SPLIT GATE MEMORY WITH IMPROVED RELIABILITY

(71) Applicants: Cheong Min Hong, Austin, TX (US); Konstantin V. Loiko, Austin, TX (US); Jane A. Yater, Austin, TX (US)

(72) Inventors: Cheong Min Hong, Austin, TX (US); Konstantin V. Loiko, Austin, TX (US); Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/446,796

(22) Filed: Jul. 30, 2014

(65) Prior Publication Data
US 2016/0035848 A1   Feb. 4, 2016

(51) Int. Cl.
| | |
|---|---|
| H01L 21/8239 | (2006.01) |
| H01L 29/423 | (2006.01) |
| H01L 29/788 | (2006.01) |
| H01L 29/792 | (2006.01) |
| H01L 29/66 | (2006.01) |
| H01L 21/265 | (2006.01) |
| H01L 29/10 | (2006.01) |
| H01L 29/08 | (2006.01) |
| H01L 29/41 | (2006.01) |

(52) U.S. Cl.
CPC .... *H01L 29/42328* (2013.01); *H01L 21/26513* (2013.01); *H01L 21/26586* (2013.01); *H01L 29/0847* (2013.01); *H01L 29/1033* (2013.01); *H01L 29/42344* (2013.01); *H01L 29/66825* (2013.01); *H01L 29/66833* (2013.01); *H01L 29/788* (2013.01); *H01L 29/792* (2013.01)

(58) Field of Classification Search
CPC ............ H01L 29/42328; H01L 29/66825; H01L 29/788; H01L 29/7881–29/7886
See application file for complete search history.

(56) References Cited

U.S. PATENT DOCUMENTS

| | | | | |
|---|---|---|---|---|
| 6,531,734 B1 * | 3/2003 | Wu | .................... | H01L 21/28273 257/315 |
| 6,642,103 B2 * | 11/2003 | Wils | ...................... | H01L 27/115 257/E21.422 |
| 6,803,276 B2 * | 10/2004 | Kim | ...................... | H01L 27/115 257/E21.682 |
| 7,301,196 B2 * | 11/2007 | Ding | .................... | H01L 27/115 257/316 |
| 7,510,936 B2 * | 3/2009 | Jung | ................. | H01L 29/42324 257/316 |
| 7,579,243 B2 * | 8/2009 | Kang | .................... | B82Y 10/00 438/267 |
| 7,611,941 B1 * | 11/2009 | Shum | ................ | H01L 21/28273 257/E21.179 |
| 7,795,091 B2 * | 9/2010 | Winstead | .......... | H01L 27/11526 257/E21.681 |
| 7,902,022 B2 * | 3/2011 | Kang | .................... | B82Y 10/00 257/E21.409 |
| 7,985,649 B1 * | 7/2011 | Winstead | .......... | H01L 21/28273 257/E21.179 |
| 8,163,615 B1 * | 4/2012 | White | ............... | H01L 21/28273 438/257 |

(Continued)

*Primary Examiner* — William F Kraig
*Assistant Examiner* — Maliheh Malek

(57) ABSTRACT

A first doped region extends from a top surface of a substrate to a first depth. Implanting into the first doped region forms a second doped region of a second conductivity type. The second doped region extends from the top surface to a second depth that is less than the first depth. A split gate NVM structure has select and control gates over the second doped region. A drain region of the second conductivity type is formed adjacent to the select gate. A source region of the second conductivity type is formed adjacent to the control gate. Angled implants into the second doped region form a third doped region of the first conductivity type under a portion of the select gate and a fourth doped region of the first conductivity type under a portion of the control gate. The drain and source regions adjoin the third and fourth regions.

19 Claims, 6 Drawing Sheets

(56) References Cited

U.S. PATENT DOCUMENTS

| | | | | |
|---|---|---|---|---|
| 8,173,505 | B2* | 5/2012 | Herrick | B82Y 10/00 257/E21.422 |
| 8,178,406 | B2* | 5/2012 | Kang | H01L 27/115 257/366 |
| 8,372,699 | B2* | 2/2013 | Kang | H01L 21/28282 257/E21.21 |
| 8,871,598 | B1* | 10/2014 | Perera | H01L 29/665 257/E21.422 |
| 8,877,585 | B1* | 11/2014 | Perera | H01L 21/28273 257/E21.422 |
| 8,906,764 | B2* | 12/2014 | Shroff | H01L 21/28273 257/E21.422 |
| 8,928,060 | B2* | 1/2015 | Tsair | H01L 29/66825 257/316 |
| 8,962,416 | B1* | 2/2015 | Winstead | H01L 29/66833 257/E21.179 |
| 9,082,650 | B2* | 7/2015 | Perera | H01L 21/28273 |
| 9,082,837 | B2* | 7/2015 | Perera | H01L 29/78 |
| 9,129,855 | B2* | 9/2015 | Perera | H01L 29/42332 |
| 9,129,996 | B2* | 9/2015 | Baker, Jr. | H01L 29/66833 |
| 9,136,129 | B2* | 9/2015 | Perera | H01L 21/28273 |
| 9,202,930 | B2* | 12/2015 | Loiko | H01L 29/42332 |
| 2004/0185614 | A1* | 9/2004 | Ding | H01L 27/115 438/257 |
| 2004/0185615 | A1* | 9/2004 | Ding | H01L 27/115 438/257 |
| 2004/0238878 | A1* | 12/2004 | Sato | H01L 27/115 257/315 |
| 2005/0142758 | A1* | 6/2005 | Jung | H01L 27/115 438/258 |
| 2006/0033145 | A1* | 2/2006 | Kakoschke | G11C 16/0416 257/315 |
| 2006/0186460 | A1* | 8/2006 | Choi | H01L 29/42324 257/315 |
| 2006/0199336 | A1* | 9/2006 | Kang | H01L 21/28273 438/261 |
| 2006/0234444 | A1* | 10/2006 | Wu | H01L 27/115 438/257 |
| 2007/0026613 | A1* | 2/2007 | Ryu | H01L 27/115 438/266 |
| 2007/0200165 | A1* | 8/2007 | Jeong | H01L 27/115 257/315 |
| 2008/0076221 | A1* | 3/2008 | Kang | B82Y 10/00 438/267 |
| 2008/0093647 | A1* | 4/2008 | Kang | H01L 29/7887 257/314 |
| 2008/0293198 | A1* | 11/2008 | Kojima | H01L 21/28273 438/259 |
| 2009/0050956 | A1* | 2/2009 | Ishimaru | H01L 27/115 257/324 |
| 2009/0085090 | A1* | 4/2009 | Nagai | H01L 21/28273 257/316 |
| 2009/0096015 | A1* | 4/2009 | Io | H01L 27/115 257/324 |
| 2009/0315100 | A1* | 12/2009 | Jeong | H01L 21/28282 257/324 |
| 2010/0059810 | A1* | 3/2010 | Homma | H01L 27/11 257/324 |
| 2010/0099246 | A1* | 4/2010 | Herrick | B82Y 10/00 438/591 |
| 2012/0142153 | A1* | 6/2012 | Jeong | G11C 16/0425 438/264 |
| 2012/0225528 | A1* | 9/2012 | Wang | H01L 21/32139 438/261 |
| 2013/0084684 | A1* | 4/2013 | Ishii | H01L 21/28282 438/257 |
| 2014/0209995 | A1* | 7/2014 | Hong | H01L 29/42328 257/325 |
| 2014/0239367 | A1* | 8/2014 | Saito | H01L 29/788 257/319 |
| 2014/0252445 | A1* | 9/2014 | Chen | H01L 21/28273 257/316 |
| 2014/0319593 | A1* | 10/2014 | Yater | H01L 21/28273 257/316 |
| 2014/0319597 | A1* | 10/2014 | Kang | H01L 27/11563 257/326 |
| 2015/0041875 | A1* | 2/2015 | Perera | H01L 29/78 257/314 |
| 2015/0348786 | A1* | 12/2015 | Loiko | H01L 21/28008 257/316 |
| 2015/0349096 | A1* | 12/2015 | Winstead | H01L 29/66833 438/591 |
| 2016/0064082 | A1* | 3/2016 | Hong | G11C 16/0433 365/185.05 |
| 2016/0064394 | A1* | 3/2016 | Chu | H01L 27/11521 257/321 |

* cited by examiner

METHOD OF FORMING SPLIT GATE MEMORY WITH IMPROVED RELIABILITY

BACKGROUND

1. Field

This disclosure relates generally to semiconductors, and more specifically, to memory and data storage devices circuitry having two gates.

2. Related Art

A particular type of memory cell is known as a split gate memory which indicates the presence of a control gate and a select gate. Split gate memory cells function as one form of non-volatile memory (NVM). Both gate electrodes affect the operation of the memory cell. A split gate memory cell has two distinguishable channel regions, respectively controlled by a select gate and a control gate, which are electrically separated by a dielectric. The select gate channel acts as an access device to select the memory cell under the control gate during read or program operations. One form of a split gate memory cell uses a control gate and a select gate of a same conductivity type. The threshold voltage of the channel is typically controlled by substrate doping within the channel region.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

For efficient operation of a split gate memory device with thin control gate dielectrics, it is desirable to have a low-magnitude natural threshold voltage, $V_{tn}$, for the control gate channel. The low magnitude $V_{tn}$ is desirable because a high control gate bias is required during read if the $V_{tn}$ is high, which results in large electric fields in the dielectric surrounding the charge storage regions. For thin dielectric layers, such high fields may disturb the programmed charge in the biased cells. Furthermore, it is desirable to have a sufficiently high threshold voltage, $V_t$, for the select gate channel in order to minimize leakage current for an unselected cell. A low threshold voltage for the control gate is desired to be able to read the memory cell with low voltage and not disturb the programmed charge of the selected memory cell. A high threshold voltage for the select gate is desired because leakage current through the channel is minimized in unselected memory cells. The natural threshold voltage associated with the control gate and select gate portions of a split gate memory cell is largely determined by a difference in the work function of each gate and the underlying channel region. There is herein provided a method and resulting memory structure in which program disturb and transconductance of split-gate memory cell is improved by pre-gate counter-doping and different combinations of subsequent array well, source halo and drain halo implants. Threshold voltage of control gate is set by pre-gate counter-doping, array well, and source halo implants. Threshold voltage of select gate is set by pre-gate counter-doping, array well, and drain halo implants.

Figure 1:
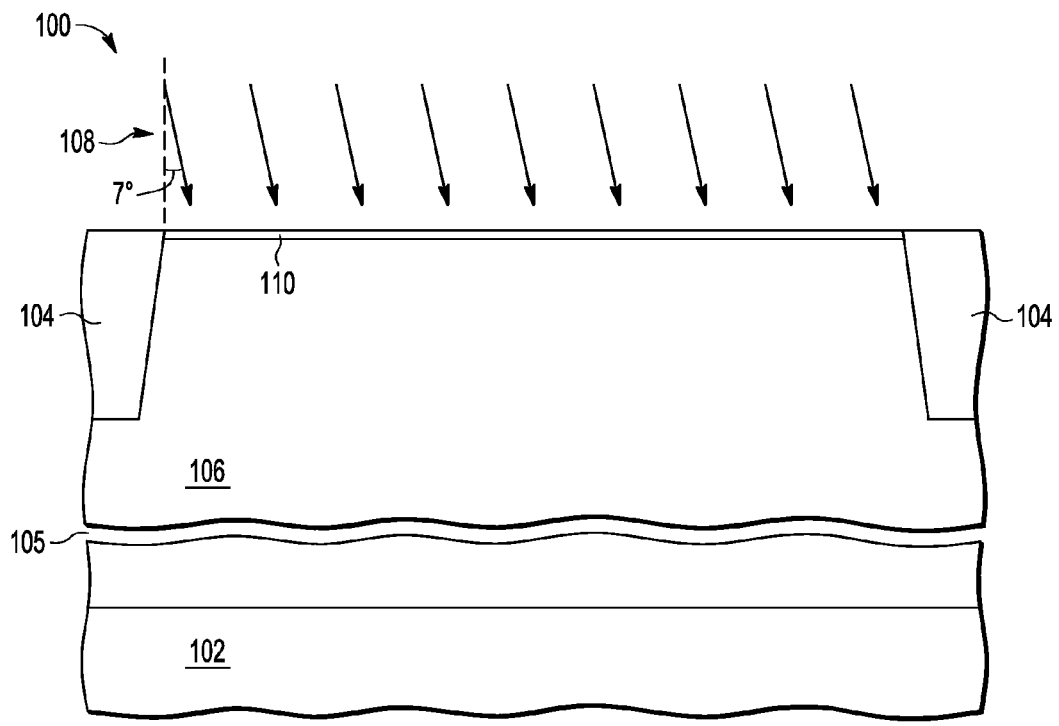
FIGS. 1-7 illustrate cross-sectional views of a split gate memory device during successive stages of manufacture in accordance with embodiments of the present invention.

Illustrated in FIG. 1 is a memory device 100 at an early stage of the formation of a split-gate memory cell. The memory device 100 includes a portion for implementing memory circuitry with electrical isolation trenches 104 separating the memory portion from other portions (not shown) on the substrate 102 that may be used to implement other devices, such as logic circuitry or other memory devices. In one form the substrate 102 is a silicon substrate but other semiconductor materials may be used for substrate 102. For example a gallium-arsenide substrate material may be used or a silicon-on-insulator (SOI) substrate may be used.

Substrate 102 further includes a deep well region 106 of a doping type similar to or the same polarity of undoped portions of substrate 102. For purposes of example, substrate 102 is assumed to be an N type material with a P type well region 106. Break lines 105 indicate that well region 106 may extend deep into the thickness of substrate 102 and under isolation trenches 104.

Before select gate and control gate structures for memory cells are formed in well region 106, blanket counter-doping 108 is performed between isolation trenches 104 with an N-type material such as arsenic, phosphorous or other suitable N-type material to form counter-doped layer 110. In some embodiments, counter-doping 108 is performed with an energy ranging from 5 to 50 kilo-electron Volts (keV) with a dose ranging from $1e^{11}$ to $1e^{13}$ per cubic centimeter (cm$^3$) at an angle ranging from five to ten degrees from a vertical axis. For example, counter-doping 108 may be performed at an angle of seven degrees with a dose of $1e^{12}$ per cm$^3$ and an implant energy 30 keV. Other suitable combinations of implant energy, dose and implant angles may be used.

Figure 2:
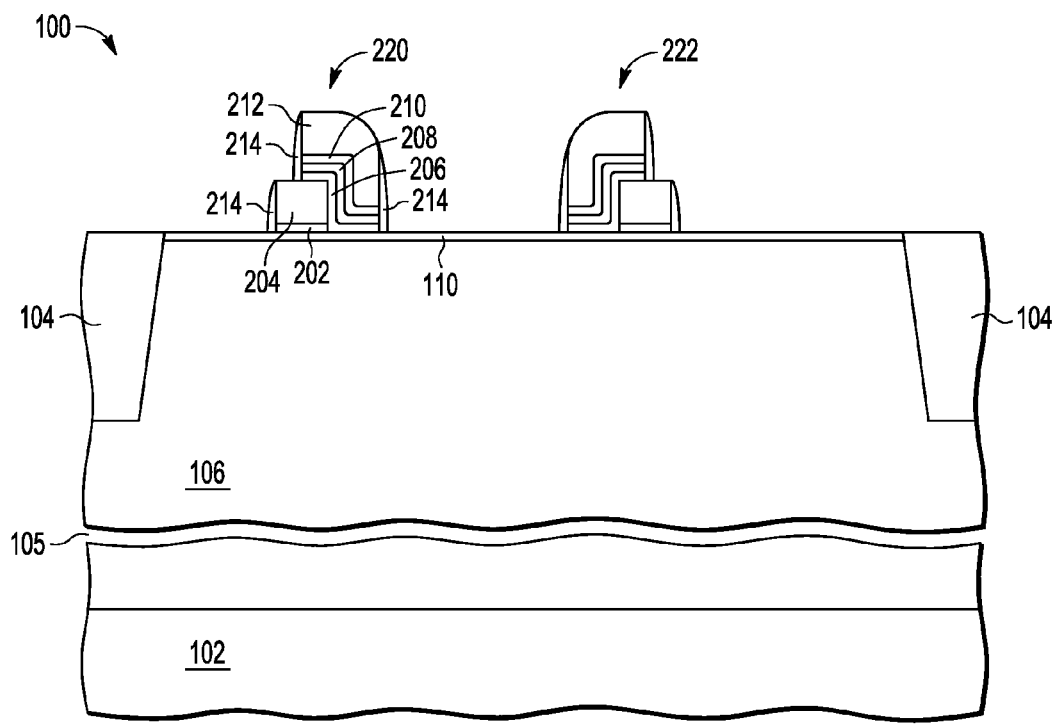

Illustrated in FIG. 2 is a side cross-sectional of memory device 100 after a subsequent stage of manufacturing during which select gate dielectric 202 is grown or deposited, polysilicon or other conductive material is deposited and etched to form select gate 204. Bottom dielectric layer 206, charge storage layer 208 and top dielectric layer 210 are grown or deposited over the top and sidewalls of select gate 204 and gate dielectric 202. Polysilicon or other conductive material is deposited over top dielectric layer 210 that will be used to form control gate 212. Bottom dielectric layer 206, charge storage layer 208, top dielectric layer 210 and control gate 212 are etched to overlap a portion of the top surface, one side of select gate 204 and gate dielectric 202, and to overlay a top surface of counter-doped layer 110. First sidewall spacers 214 are formed on sidewalls of select gate 204 and control gate 212 to form gate structure for a first memory cell 220. The example shown in FIG. 2 includes gate structures for two memory cells 220, 222, with memory cell 222 being a mirror image of memory cell 220.

Figure 3:
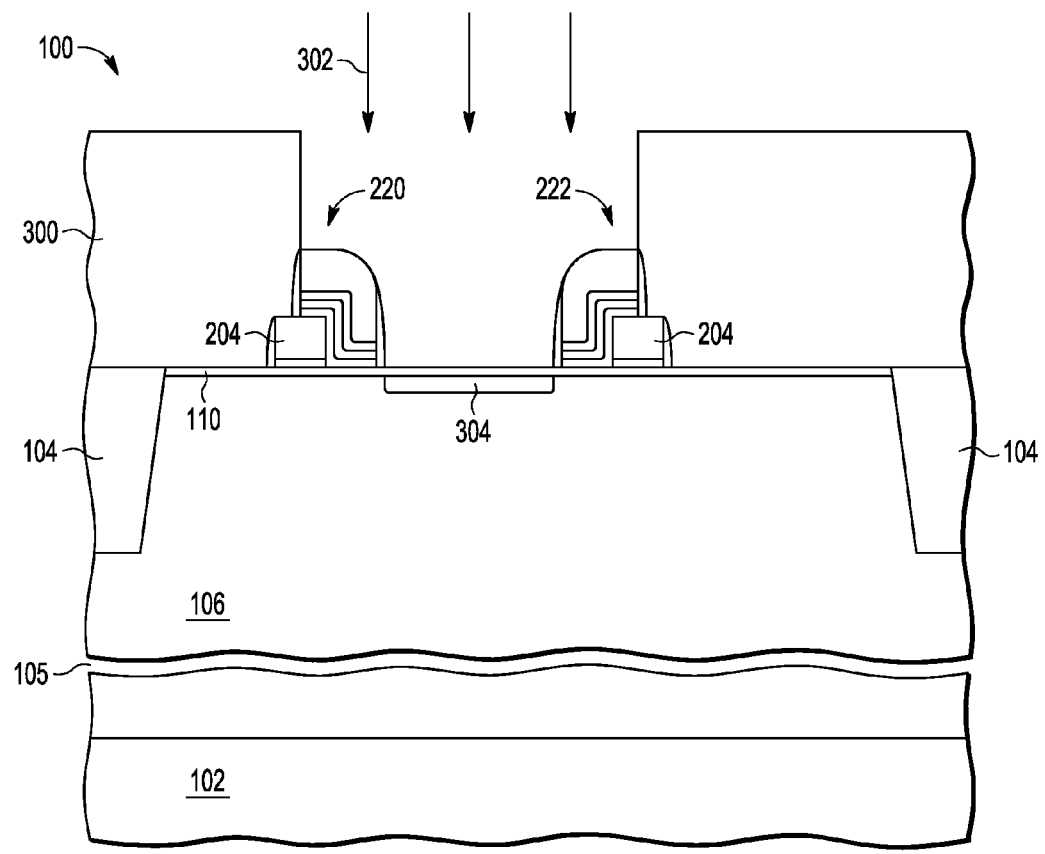

Referring to FIG. 3, a side cross-sectional view of memory device 100 is shown with mask 300 overlying exposed portions of select gates 204 and exposed portions of counter-doped layer 110 directly adjacent select gate 204 to perform doping 302 with an N-type material of an unmasked area of P-well 106. In one form the mask 300 is photoresist but other suitable mask materials may be used. With mask 300 in place to protect the select gates 204 and regions of P-well 105 adjacent select gate 204, the exposed portion of P-well 106 directly adjacent control gate 212 is doped 302 with an N-type material to form source extension implant 304 for memory cells 220, 222. Various dopants such as arsenic, phosphorous or other suitable N-type material may be used for source extension implant 304. In some embodiments, doping 302 is performed with an energy ranging from 15 to 40 kilo-electron Volts (keV) with a dose ranging from $1e^{13}$ to $1e^{15}$ per cubic centimeter (cm$^3$) at an angle of zero degrees from a vertical axis. For example, doping 302 may be performed at an angle of zero degrees with a dose of arsenic of $1e^{14}$ per cm$^3$ and an implant energy 20 keV. Other suitable combinations of implant energy, dose and implant angles may be used.

Figure 4:
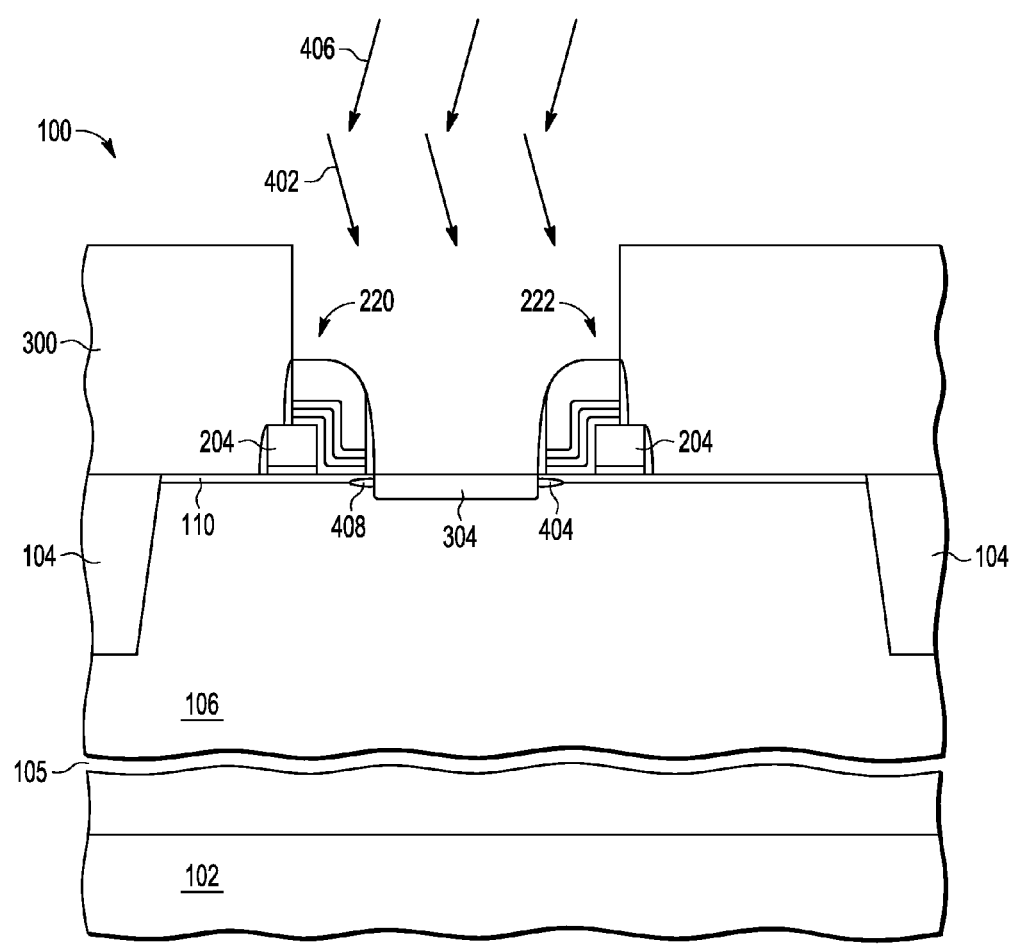

Referring to FIG. 4, a side cross-sectional view of memory device 100 is shown with mask 300 remaining in place to perform a first angled doping 402 with a P-type material to form source halo implant 404 for memory cell 220 and a second angled doping 406 with a P-type material to form source halo implant 408 for memory cell 222. Various dopants such as boron, boron difluoride (BF$_2$) or other suitable P-type material may be used for source halo implants 404, 408. In some embodiments, doping 402, 406 is performed with an energy ranging from 5 to 40 kilo-electron Volts (keV) with a dose ranging from $5e^{11}$ to $5e^{13}$ per cubic centimeter (cm$^3$) at an angle ranging from twenty to forty degrees from a vertical axis. For example, doping 402, 406 may be performed at angles of thirty degrees with a dose of boron of $5e^{12}$ per cm$^3$ and an implant energy 20 keV. Other suitable combinations of implant energy, dose and implant angles may be used.

Figure 5:
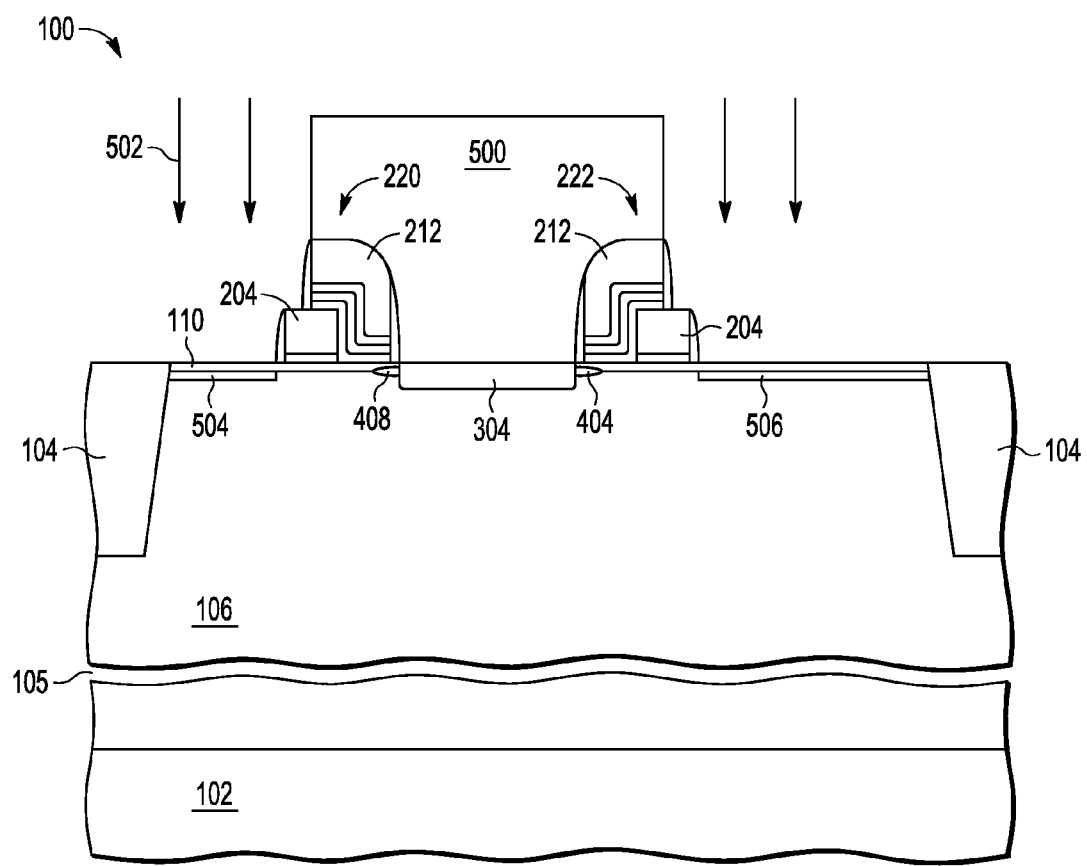

Illustrated in FIG. 5 is further processing of memory device 100 after mask 300 (FIG. 4) is removed and another mask 500 is applied overlying exposed portions of control gates 212 and source extension 304 between control gates 212. With mask 500 in place to protect the control gates 214 and source extension 304, doping 502 is performed with an N-type material of unmasked areas of P-well 106 adjacent select gates 204 to form drain extension implants 504, 506 for memory cells 220, 222. In one form the mask 500 is photoresist but other suitable mask materials may be used. Various dopants such as arsenic, phosphorous or other suitable N-type material may be used for drain extension implants 504, 506. In some embodiments, doping 502 is performed with an energy ranging from 1 to 30 kilo-electron Volts (keV) with a dose ranging from $5e^{13}$ to $5e^{15}$ per cubic centimeter (cm$^3$) at an angle of zero degrees from a vertical axis. For example, doping 502 may be performed at an angle of zero degrees with a dose of arsenic of $5e^{14}$ per cm$^3$ and an implant energy 10 keV. Other suitable combinations of implant energy, dose and implant angles may be used.

Figure 6:
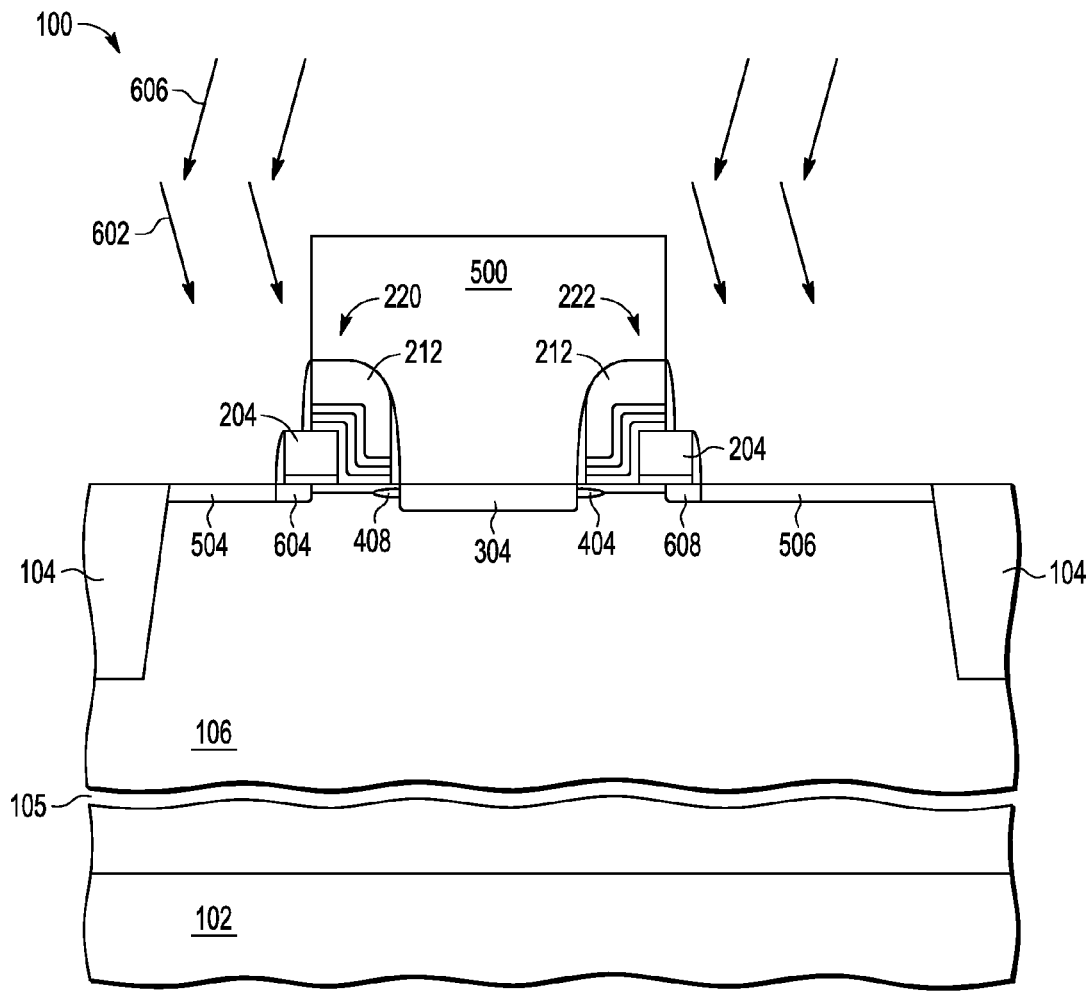

Referring to FIG. 6, a side cross-sectional view of memory device 100 is shown with mask 500 remaining in place to perform a first angled doping 602 with a P-type material to form drain halo implant 604 for memory cell 220 and a second angled doping 606 with a P-type material to form drain halo implant 608 for memory cell 222. Various dopants such as boron, boron difluoride (BF$_2$) or other suitable P-type material may be used for drain halo implants 604, 608. In some embodiments, doping 602, 606 is performed with an energy ranging from 5 to 50 kilo-electron Volts (keV) for boron and twenty to two hundred keV for BF$_2$. The dose can range from $1e^{12}$ to $1e^{14}$ per cubic centimeter (cm$^3$) at an angle ranging from twenty to forty-five degrees from a vertical axis. For example, doping 602, 606 may be performed at an angle of thirty degrees with a dose of BF$_2$ of $5e^{13}$ per cm$^3$ and an implant energy 120 keV. Alternatively, doping 602, 606 may be performed at angles of thirty degrees with a dose of boron of boron of $1e^{13}$ per cm$^3$ and an implant energy 20 keV. Other suitable combinations of implant energy, dose and implant angles may be used.

Figure 7:
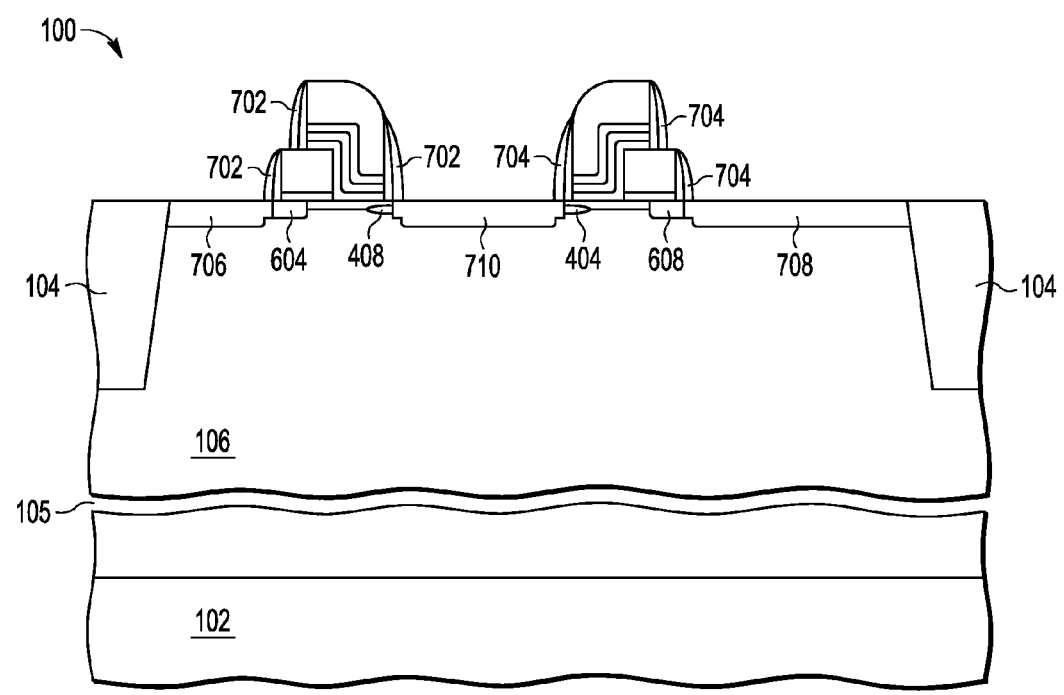

Illustrated in FIG. 7 is a side cross-sectional view of memory device 100 is shown wherein after mask 500 (FIG. 5) is removed and final sidewall spacers 702, 704 are formed over spacers 214 on sidewalls of select gates 204, control gates 212, dielectric layers 206, 210 (FIG. 2), and charge storage layer (208) (FIG. 2) of respective memory cells 220, 222. Sidewall spacers 702, 704 function primarily to protect certain surfaces of the gate structures from subsequent silicidation, which can be performed to enable low resistance electrical contacts (not shown) to the source, drain, control gate and select gate. Undesired silicidation can modify the electrical properties of the devices and possibly cause unintended electrical connections. Before silicidation is performed, deep drains 706, 708 are formed in the area of drain extensions 504 and deep source 710 is formed in the area of source extension 304. In some embodiments, deep drains 706, 708 and deep source 710 are formed with a P-type material such as arsenic, phosphorous, or a combination of arsenic and phosphorous. An implant energy ranging from 10 to 50 kilo-electron Volts (keV) can be used for arsenic and/or phosphorous. The dose of P-type material can range from $1e^{13}$ to $1e^{16}$ per cubic centimeter (cm$^3$) at an angle of zero degrees from a vertical axis. For example, deep drains 706, 708 and deep source 710 may be performed at an angle of zero degrees with a dose of arsenic of $1e^{15}$ per cm$^3$ and $1e^{14}$ per cm$^3$ for phosphorous, and an implant energy 30 keV. Other suitable combinations of implant energy, dose and implant angles may be used.

By blanket counter-doping P-well 106 before select gates 204 and control gates 212 are formed, a retrograde doping profile is created under select gates 204 midway between sidewalls of select gates 204. The drain halo implants 604, 608 decrease overlap of the counter-doping 110 under select gates 204. Counter-doped layer 110 prevents lower edges and corners of select gates 204 from being exposed to halo implants 404, 408, thereby reducing leakage of select gates 204. Additionally, counter-doped layer 110 creates higher implant levels in P-well 106 than would otherwise be possible if the doping was performed after gates 204, 212 are present. The higher doping levels achieve higher drive current, which enables faster operation of memory cells 220, 222.

By now it should be appreciated that in some embodiments, there has been provided a method of making a semiconductor structure (108) using a substrate (102) having a first doped region (106) of a first conductivity type, wherein the first doped region extends from a top surface of the substrate to a first depth. The method can comprise implanting into the first doped region to form a second doped region (110) of a second conductivity type in the first doped region. The second doped region extends from the top surface to a second depth that is less than the first depth. The second depth is less than the first depth. A split gate non-volatile memory (NVM) (220) structure is formed over the second doped region, wherein the split gate NVM structure has a select gate (204) and a control gate (212). A drain region (504) of the second conductivity type is formed in the substrate adjacent to the select gate and a source region (309) of the second conductivity type in the substrate adjacent to the control gate. Angled implants (402/406, 602/606) into the second doped region are performed to form a third doped region (604) of the first conductivity type under a portion of the select gate and a fourth doped region (608) of the first conductivity type under a portion of the control gate. The drain region adjoins the third doped region; and the source region adjoins the fourth doped region.

In another aspect, the forming the drain region can be performed after the performing angled implants.

In another aspect, the forming the drain region can be performed prior to the performing angled implants.

In another aspect, the first conductivity type can be P-type and the second conductivity type can be N-type.

In another aspect, the performing angled implants can comprise performing a first angled implant to form the third doped region; and performing a second angled implant to form the fourth doped region.

In another aspect, the implanting into the first doped region can be performed at a first dose.

In another aspect, the first angled implant can be performed at a higher dose than the first dose.

In another aspect, the second angled implant can be performed at a higher dose than the first dose.

In another aspect, the forming the drain region and the source region can comprise performing a drain implant (502) to form the drain region; and performing a source implant (302) to form the source region.

In another aspect, the forming the split gate structure can comprise forming a nanocrystal layer (218) between the control gate and the substrate.

In another aspect, implanting into the first doped region to form the second doped region comprises implanting at a first angle (7), and performing the angled implants can be further characterized by the angled implants having at least a second angle that is greater than the first angle.

In another aspect, the performing the angled implant can be further characterized by the angled implants being in a range of 20 to 45 degrees relative to vertical.

In other embodiments, a semiconductor structure (100) can have a substrate (102) having a first doped region (106) of a first conductivity type, wherein the first doped region extends from a top surface of the substrate to a first depth. The structure can further comprise a split gate non-volatile memory (NVM) structure (220) over the substrate, wherein the split gate NVM structure has a select gate (204) and a control gate (212). A drain region (706) of a second conductivity type can be in the substrate adjacent to the select gate. A source region (710) of the second conductivity type can be in the substrate adjacent to the control gate. A counterdoped region (110) of the second conductivity type can be at the top surface of the substrate and under the select gate and the control gate. A first halo region (408) of the first conductivity type can be between the source region and the counterdoped region. A second halo region (604) of the first conductivity type can be between the drain region and the counterdoped region.

In another aspect, the counterdoped region can have a first doping concentration, the first halo region can have a second doping concentration, and the first doping concentration can be less than the second doping concentration.

In another aspect, the second halo region has a third doping concentration and the first doping concentration can be less than the second doping concentration.

In another aspect, the first conductivity type can be P-type and the second conductivity type can be N-type.

In another aspect, the first halo region can have a first depth below the surface of the substrate, the second halo region can have a second depth below the surface of the substrate, the counterdoped region can have a third depth below the surface of the substrate, and the third depth can be less than the first depth and the second depth.

In another aspect, the source region can have a fourth depth below the surface of the substrate, the drain region can have fifth depth below the surface of the substrate, the second depth can be less than the fourth depth and the fifth depth, and the third depth can be less than the fourth depth and the fifth depth.

In further embodiments, a method of making a semiconductor structure (100) using a substrate (102) having a first doped region (106) of a first conductivity type that extends from a top surface of the substrate to a first depth can comprise counterdoping the top surface to form a second doped region (110) at a second depth below the top surface of the substrate, and forming a split-gate structure (220) over the substrate having a control gate (212), a select gate (214), and a charge storage layer (218). The charge storage layer can be between the control gate and the substrate. A source region (304) can be formed (302) in the substrate adjacent to the control gate and a drain region (504) in the substrate adjacent to the select gate. A portion of the second doped region under the select gate can be counterdoped (602/606)) to form a first halo region (408) under the select gate, wherein the first halo region adjoins the drain region. A portion of the second doped region under the control gate can be counterdoped (402/406) to form a second halo region under the control gate, wherein the second halo region adjoins the source region.

In another aspect, the steps of counterdoping a portion of the second doped region comprise implanting at an angle of at least 20 degrees.

Although the invention has been described with respect to specific conductivity types or polarity of potentials, skilled artisans appreciated that conductivity types and polarities of potentials may be reversed. Moreover, the terms "front," "back," "top," "bottom," "over," "under", "above", "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the sequence of etches leading to formation of the select gate and control gate may be modified or reversed. The shapes and exact position of the select gate relative to the control gate may be modified. Various forms of on implementation may be used including angled or halo implants. Various semiconductor technologies, including gallium arsenide and metal semiconductor oxide (MOS) may be used to implement the split-gate memory cells.

Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate having a first doped region of a first conductivity type, wherein the first doped region extends from a top surface of the substrate to a first depth, comprising:
   implanting into the first doped region to form a second doped region of a second conductivity type in the first doped region, wherein:
      the second doped region extends from the top surface to a second depth that is less than the first depth; and
   forming a split gate non-volatile memory (NVM) structure over the second doped region, wherein the split gate NVM structure has a select gate and a control gate;
   forming a drain region of the second conductivity type in the substrate adjacent to the select gate and a source region of the second conductivity type in the substrate adjacent to the control gate; and
   performing angled implants into the second doped region to form a third doped region of the first conductivity type at a third depth below the surface of the substrate under a portion of the select gate and a fourth doped region of the first conductivity type at a fourth depth below the surface of the substrate under a portion of the control gate;
   wherein:
      the drain region adjoins the third doped region;
      the source region adjoins the fourth doped region; and
      the second depth is less than the third depth and the fourth depth.

2. The method of claim 1, wherein the forming the drain region is performed after the performing angled implants.

3. The method of claim 1, wherein the forming the drain region is performed prior to the performing angled implants.

4. The method of claim 1, wherein the first conductivity type is P-type and the second conductivity type is N-type.

5. The method of claim 1, wherein the performing angled implants comprises:
   performing a first angled implant to form the third doped region; and
   performing a second angled implant to form the fourth doped region.

6. The method of claim 5, wherein the implanting into the first doped region is performed at a first dose.

7. The method of claim 6, wherein the first angled implant is performed at a higher dose than the first dose.

8. The method of claim 7, wherein the second angled implant is performed at a higher dose than the first dose.

9. The method of claim 8, wherein the forming the drain region and the source region comprises:
   performing a drain implant to form the drain region; and
   performing a source implant to form the source region.

10. The method of claim 1, wherein the forming the split gate structure comprises forming a nanocrystal layer between the control gate and the substrate.

11. The method of claim 1 wherein:
   implanting into the first doped region to form the second doped region comprises implanting at a first angle; and
   performing the angled implants is further characterized by the angled implants having at least a second angle, wherein the second angle is greater than the first angle.

12. The method of claim 1, wherein the performing the angled implants is further characterized by the angled implants being in a range of 20 to 45 degrees relative to vertical.

13. A method of making a semiconductor structure using a substrate having a first doped region of a first conductivity type, wherein the first doped region extends from a top surface of the substrate to a first depth, comprising:
   counterdoping the top surface to form a second doped region at a second depth below the top surface of the substrate;
   forming a split-gate structure over the substrate having a control gate, a select gate, and a charge storage layer, wherein the charge storage layer is between the control gate and the substrate;
   forming a source region in the substrate adjacent to the control gate and a drain region in the substrate adjacent to the select gate;
   counterdoping a portion of the second doped region under the select gate to form a first halo region under the select gate, wherein the first halo region adjoins the drain region; and
   counterdoping a portion of the second doped region under the control gate to form a second halo region under the control gate, wherein the second halo region adjoins the source region,
   wherein the second depth is less than
      the first depth,
      a depth of the first halo region, and
      a depth of the second halo region.

14. The method of claim 13, wherein the steps of counterdoping a portion of the second doped region comprise implanting at an angle of at least 20 degrees.

15. A method of making a semiconductor structure having a substrate having a first doped region of a first conductivity type, wherein the first doped region extends from a top surface of the substrate to a first depth, comprising:
   forming a split gate non-volatile memory (NVM) structure over the substrate, wherein the split gate NVM structure has a select gate and a control gate;
   implanting a drain region of a second conductivity type in the substrate adjacent to the select gate;
   implanting a source region of the second conductivity type in the substrate adjacent to the control gate;
   counterdoping a region of the second conductivity type at the top surface of the substrate and under the select gate and the control gate to form a counterdoped region;
   implanting a first halo region of the first conductivity type between the source region and the counterdoped region; and
   implanting a second halo region of the first conductivity type between the drain region and the counterdoped region,
   wherein the first halo region has a first depth below the surface of the substrate, the second halo region has a second depth below the surface of the substrate, the counterdoped region has a third depth below the surface of the substrate, and the third depth is less than the first depth and the second depth.

16. The method of claim 15, wherein the counterdoped region has a first doping concentration, the first halo region has a second doping concentration, and the first doping concentration is less than the second doping concentration.

17. The method of claim 16, wherein the second halo region has a third doping concentration and the first doping concentration is less than the second doping concentration.

18. The method of claim 17, wherein the first conductivity type is P-type and the second conductivity type is N-type.

19. The method of claim 15, wherein the source region has a fourth depth below the surface of the substrate, the drain region has fifth depth below the surface of the substrate, the second depth is less than the fourth depth and the fifth depth, and the third depth is less than the fourth depth and the fifth depth.

* * * * *